United States Patent
Steiner et al.

(10) Patent No.: US 11,777,047 B2
(45) Date of Patent: *Oct. 3, 2023

(54) TWO-JUNCTION PHOTOVOLTAIC DEVICES

(71) Applicants: Alliance for Sustainable Energy, LLC, Golden, CO (US); Georgia Tech Research Corporation, Atlanta, GA (US)

(72) Inventors: Myles Aaron Steiner, Denver, CO (US); Daniel Joseph Friedman, Lakewood, CO (US); Ryan Matthew France, Golden, CO (US); Asegun Henry, Boston, MA (US)

(73) Assignees: Alliance for Sustainable Energy, LLC, Golden, CO (US); Georgia Tech Research Corporation, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/664,085

(22) Filed: May 19, 2022

(65) Prior Publication Data
US 2022/0293810 A1 Sep. 15, 2022

Related U.S. Application Data

(63) Continuation of application No. 16/269,848, filed on Feb. 7, 2019, now Pat. No. 11,367,802.
(Continued)

(51) Int. Cl.
*H01L 31/00* (2006.01)
*H01L 31/0735* (2012.01)
(Continued)

(52) U.S. Cl.
CPC ...... *H01L 31/0735* (2013.01); *H01L 31/0725* (2013.01); *H01L 31/1892* (2013.01); *H02S 10/30* (2014.12)

(58) Field of Classification Search
CPC ............. H01L 31/0735; H01L 31/0725; H01L 31/1892; H02S 10/30; Y02P 70/50
See application file for complete search history.

(56) References Cited

U.S. PATENT DOCUMENTS 4,836,862 A 6/1989 Pelka et al.
5,512,108 A 4/1996 Noreen
(Continued)

FOREIGN PATENT DOCUMENTS

JP H094824 A * 1/1997
RU 2396655 C1 * 8/2010

OTHER PUBLICATIONS

Amy ("Thermal energy grid storage using multi-junction photovoltaics," published Nov. 19, 2018) Energy Environ. Sci., 2019, 12, 334 (Year: 2018).*

(Continued)

*Primary Examiner* — Angelo Trivisonno
(74) *Attorney, Agent, or Firm* — Michael A. McIntyre

(57) ABSTRACT

The present disclosure relates to a photovoltaic (PV) device that includes a first junction constructed with a first alloy and having a bandgap between about 1.0 eV and about 1.5 eV, and a second junction constructed with a second alloy and having a bandgap between about 0.9 eV and about 1.3 eV, where the first alloy includes III-V elements, the second alloy includes III-V elements, and the PV device is configured to operate in a thermophotovoltaic system having an operating temperature between about 1500° C. and about 3000° C.

9 Claims, 14 Drawing Sheets

Related U.S. Application Data

(60) Provisional application No. 62/627,837, filed on Feb. 8, 2018.

(51) Int. Cl.
  *H02S 10/30* (2014.01)
  *H01L 31/0725* (2012.01)
  *H01L 31/18* (2006.01)

(56) References Cited

U.S. PATENT DOCUMENTS

| | | | |
|---|---|---|---|
| 8,969,712 | B2 | 3/2015 | Newman et al. |
| 2008/0190479 | A1 | 8/2008 | Hsieh et al. |
| 2010/0147366 | A1* | 6/2010 | Stan .................... H01L 31/0547 257/E31.127 |
| 2013/0048063 | A1* | 2/2013 | Walters ................ H01L 31/036 716/110 |
| 2014/0261611 | A1 | 9/2014 | King et al. |
| 2015/0053257 | A1 | 2/2015 | Dimroth et al. |
| 2017/0352536 | A1 | 12/2017 | Bugge et al. |

OTHER PUBLICATIONS

Garcia ("Metamorphic Ga0.76In0.24As/GaAs0.75Sb0.25 tunnel junctions grown on GaAs substrates") J. Appl. Phys. 116, 074508 (2014); https://doi.org/10.1063/1.4892773 (Year: 2014).*

Zhang ("Gas Source MBE Grown Wavelength Extending InGaAs Photodetectors") Advances in Photodiodes Edited by Gian-Franco Dalla Betta (Year: 2011).*

English translation of Goldstein (JP H094824 A) (Year: 2023).*

English machine translation of Tarasov (RU 2396655 C1) (Year: 2023).*

Emziane, M. et al., "Investigation of InGaAsP-based solar cells for double-junction photovoltaic devices," Thin Solid Films, vol. 516, 2008, pp. 6744-6747.

France, R. et al., "Design Flexibility of Ultrahigh Efficiency Four-Junction Inverted Metamorphic Solar Cells," IEEE Journal of Photovoltaics, vol. 6, No. 2, Mar. 2016, pp. 578-583.

France, R. et al., "Metamorphic epitaxy for multijunction solar cells," MRS Bulletin, vol. 41, Mar. 2016, pp. 202-209.

Geisz, J. et al., "Generalized Optoelectronic Model of Series-Connected Multijunction Solar Cells," IEEE Journal of Photovoltaics, vol. 5, No. 6, Nov. 2015, pp. 1827-1839.

Hudait, M. et al., Comparison of mixed annion, InAsyP1-y and mixed cation, InxAl1—xAs metamorphic buffers grown by molecular beam epitaxy on (100) InP substrates, Journal of Applied Physics, vol. 95, No. 8, Apr. 15, 2004, pp. 3952-3960.

Hudait, M. et al., "Metamorphic In0.7Al0.3As/In0.69Ga0.31As thermophotovoltaic devices grown on graded InAsyP1-y buffers by molecular beam epitaxy," Solid State Electronics, vol. 53, 2009, pp. 102-106.

King, R. et al., "40% efficient metamorphic GaInP/GaInAs/Ge multijunction solar cells," Applied Physics Letters, vol. 90, 2007, pp. 183516-1 through 183516-3.

Kosten, E. et al., "Highly efficient GaAs solar cells by limiting light emission angle," Nature Light: Science & Applications, vol. 2, e45, 2013, pp. 1-6.

Kunitsyna, E. et al., "Narrow gap III-V materials for infrared photodiodes and thermophotovoltaic cells," Optical Materials, vol. 32, 2010, pp. 1573-1577.

Lenert, A. et al., "Role of spectral non-idealities in the design of solar thermophotovoltaics," Optics Express, vol. 22, Oct. 2014, 15 pages.

Levander, A. et al.., "Examination of Dislocations in Lattice-Mismatched GaInAs/Buffer Layer/GaAs for III-V Photovoltaics," U.S. Department of Energy Journal of Undergraduate Research, 2007.

Omair, Z. et al., "Experimental Demonstration of 28.2% Thermophotovoltaic Conversion Efficiency," Optical Society of America, AW30.7, 2018, two pages.

St.-Gelais, R. et al., "Hot Carrier-Based Near-Field Thermophotovoltaic Energy Conversion," ACS Nano, vol. 11, Mar. 13, 2017, pp. 3001-3009.

Seyf, H. R. et al., "Thermophotovoltaics: a potential pathway to high efficiency concentrated solar power," Energy & Environmental Science, vol. 9, 2016, pp. 2654-2665.

Swanson, R., "Silicon Photovoltaic Cells in Thermophotovoltaic Energy Conversion," IEEE, 1978 International Electron Devices Meeting, pp. 70-73.

* cited by examiner

TWO-JUNCTION PHOTOVOLTAIC DEVICES

CROSS-REFERENCE TO RELATED APPLICATIONS

This application is a continuation application from U.S. Non-provisional patent application Ser. No. 16/269,848 filed on Feb. 7, 2019, which claims the benefit of U.S. Provisional Patent Application No. 62/627,837 filed Feb. 8, 2018, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

SUMMARY

An aspect of the present disclosure is a photovoltaic (PV) device that includes a first junction constructed with a first alloy and having a bandgap between about 1.0 eV and about 1.5 eV, and a second junction constructed with a second alloy and having a bandgap between about 0.9 eV and about 1.3 eV, where the first alloy includes III-V elements, the second alloy includes III-V elements, and the PV device is configured to operate in a thermophotovoltaic system having an operating temperature between about 1500° C. and about 3000° C. In some embodiments of the present disclosure, the first alloy includes at least two of aluminum, gallium, indium, arsenic, and/or phosphorus. In some embodiments of the present disclosure, the second alloy includes at least two of aluminum, gallium, indium, arsenic, and/or phosphorus.

In some embodiments of the present disclosure, the first alloy includes $Al_xGa_yIn_{1-x-y}As_zP_{1-z}$, where $0 \leq x \leq 1$, $0 \leq y \leq 1$ and $0 \leq z \leq 1$ and has a bandgap of between about 1.1 eV and about 1.5 eV. In some embodiments of the present disclosure, the first alloy includes at least one of about $Al_{0.15}Ga_{0.56}In_{0.29}As$ and/or about $Ga_{0.5}In_{0.5}As_{0.57}P_{0.43}$. In some embodiments of the present disclosure, the second alloy includes $Ga_wIn_{1-w}As$, where $0 \leq w \leq 1$ and has a bandgap between about 0.9 eV and about 1.2 eV. In some embodiments of the present disclosure, the second alloy includes about $Ga_{0.7}In_{0.3}As$. In some embodiments of the present disclosure, the first alloy includes about $Al_{0.15}Ga_{0.56}In_{0.29}As$ and has a bandgap of about 1.2 eV, the second alloy includes about $Ga_{0.7}In_{0.3}As$ and has a bandgap of about 1.0 eV, and the PV device is configured for the operating temperature between about 1900° C. and about 2100° C.

In some embodiments of the present disclosure, the first alloy includes GaAs having a bandgap of about 1.4 eV. In some embodiments of the present disclosure, the second alloy includes $Ga_{0.85}In_{0.15}As$ and has a bandgap of about 1.2 eV. In some embodiments of the present disclosure, the first alloy includes GaAs and has a bandgap of about 1.4 eV, the second alloy includes about $Ga_{0.85}In_{0.15}As$ and has a bandgap of about 1.2 eV, and the PV device is configured for the operating temperature between about 2400° C.

In some embodiments of the present disclosure, the PV device may further include a tunnel junction positioned between the first junction and the second junction. In some embodiments of the present disclosure, the tunnel junction may include at least two of gallium, indium, arsenide, and/or antimony. In some embodiments of the present disclosure, the PV device may further include a buffer layer positioned between the first junction and the second junction. In some embodiments of the present disclosure, the buffer layer may be constructed of an alloy that includes at least two of gallium, indium, arsenide, and/or antimony. In some embodiments of the present disclosure, the buffer layer may be a compositionally graded buffer layer comprising between two and 15 layers. In some embodiments of the present disclosure, the alloy of the buffer layer may include $Ga_xIn_{1-x}P$ and $0.20 \leq x \leq 0.51$. In some embodiments of the present disclosure, the PV device may further include at least one of a substrate and/or a buffer layer, where the at least one of the substrate and/or the buffer layer is configured to be removed from the PV device.

An aspect of the present disclosure is a thermophotovoltaic (TPV) system that includes an emitter operating at a temperature between about 1900° C. and about 2400° C., and a photovoltaic (PV) device, where the emitter is configured to transfer radiant energy to the PV device, and the PV device includes a first junction constructed with a first III-V alloy and having a bandgap between about 1.0 eV and about 1.5 eV, and a second junction constructed with a second III-V alloy and having a bandgap between about 0.9 eV and about 1.3 eV.

An aspect of the present disclosure is a method that includes operating an emitter at a temperature between about 1900° C. and about 2400° C. to create radiant energy, transferring at least a portion of the radiant energy to a photovoltaic (PV) device, and converting at least a portion of the transferred radiant energy to electricity, where the PV device includes a first junction constructed with a first III-V alloy and having a bandgap between about 1.0 eV and about 1.5 eV, and a second junction constructed with a second III-V alloy and having a bandgap between about 0.9 eV and about 1.3 eV.

BRIEF DESCRIPTION OF THE DRAWINGS

Some embodiments are illustrated in referenced figures of the drawings. It is intended that the embodiments and figures disclosed herein are to be considered illustrative rather than limiting.

Figure 1:
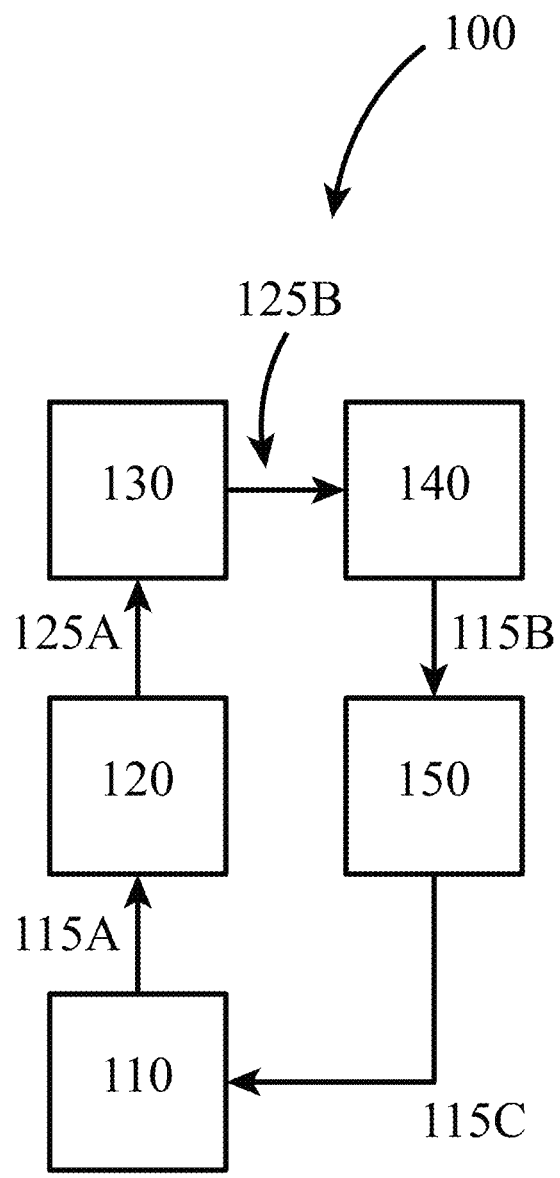
FIG. 1 illustrates a TPV energy system, according to some embodiments of the present disclosure.

| REFERENCE NUMBERS | |
|---|---|
| 100 | thermophotovoltaic (TPV) energy system |
| 110 | first tank |
| 115 | cold heat transfer (HT) fluid |
| 120 | heat source |
| 125 | hot HT fluid |
| 130 | second tank |
| 140 | TPV unit |
| 150 | pump |
| 200 | photovoltaic (PV) device |
| 210 | heat transfer fluid channel |
| 220 | space |
| 225 | emitter |
| 230 | outer layer |
| 240 | multijunction PV stack |
| 250 | reflective layer |
| 300 | substrate |
| 310 | buffer layer |
| 320 | first junction |
| 330 | tunnel junction |
| 340 | second junction |
| 350 | handle |

DETAILED DESCRIPTION

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present disclosure, the term "substantially" is defined as approaching a specific numeric value or target to within 20%, 15%, 10%, 5%, or within 1% of the value or target. In further embodiments of the present disclosure, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present disclosure, the term "about" is used to indicate an uncertainty limit of less than or equal to ±20%, ±15%, ±10%, ±5%, or ±1% of a specific numeric value or target. In some embodiments of the present disclosure, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to new designs for multi-junction (e.g. two junction) photovoltaic devices, which in some embodiments, may be used in thermophotovoltaic (TPV) storage applications. In TPV energy systems, the energy is provided by an emitter (for example, a material such as a metal or semiconductor), which is heated to a working temperature $T_w$ by a heat source. The TPV emitter can be described as a blackbody having an emission spectrum characteristic of $T_w$ and of the emissivity of the emitter material, and which transfers energy by radiant heat transfer to a photovoltaic device, which converts the radiant energy to electricity. In some embodiments of the present disclosure, a TPV energy system and its associated photovoltaic device designs and emitter may operate at a $T_w$ that is between about 1500° C. and about 3000° C., or between about 1900° C. and about 2400° C., much higher than typical TPV applications which are often less than 1200° C. As a result of the higher $T_w$, the target bandgaps of the photovoltaic device are also higher than they would be for a lower $T_w$. In some embodiments of the present disclosure, the target bandgaps may be between about 1.1 eV and about 1.4 eV for the top junction (the first junction to receive light) and between about 0.9 eV and about 1.2 eV for the bottom junction (the second junction to receive light; e.g. the remaining light that has passed through the top junction).

FIG. 1 illustrates a TPV energy system 100, according to some embodiments of the present disclosure. In this example, the TPV energy system 100 has a thermophotovoltaic unit 140 in which radiant heat transfer occurs from an emitter (not shown) to at least one photovoltaic device (not shown), resulting in the conversion of thermal energy to electricity. (The emitter and photovoltaic device are explained in more detail in FIG. 2A.) As shown in FIG. 1, the TPV energy system 100 may be configured as a circuit through which a heat transfer (HT) fluid is circulated using a pump 150. Although FIG. 1 only illustrates one pump 150, in some embodiments of the present disclosure, one or more pumps may be utilized to move the HT fluid between the various unit operations of the TPV energy system 100. This may, for example, depend on the design of one or more of the unit operations. Examples of HT fluids suitable for the present application include liquid silicon or liquid iron, among other possibilities. The HT fluid may be stored in a first tank 110, where the HT fluid is at some temperature that is less than the targeted $T_w$ by at least about 500° C. When needed, this relatively "cold" HT fluid 115A may be circulated to a heat source 120 by the pump 150 where the cold HT fluid 115A is heated to a temperature that is greater than or equal to the targeted $T_w$, resulting in a relatively "hot" HT fluid 125A. As described herein, the hot HT fluid temperature is targeted for a $T_w$ (or range of temperatures) that results in the emitter radiating wavelengths of light that can be absorbed with high efficiencies by the photovoltaic device. The hot HT fluid 125A may be directed to a second tank 130 for storage until needed and/or the hot HT fluid 125A may be fed directly to the downstream thermophotovoltaic (TPV) unit 140. After heat is transferred from the hot HT fluid 125B to the photovoltaic device (not shown) positioned within the thermophotovoltaic unit 140, the resultant cold HT fluid (115B and/or 115C) may then be transferred back to the first tank 110 by the pump 150.

Figure 2A:
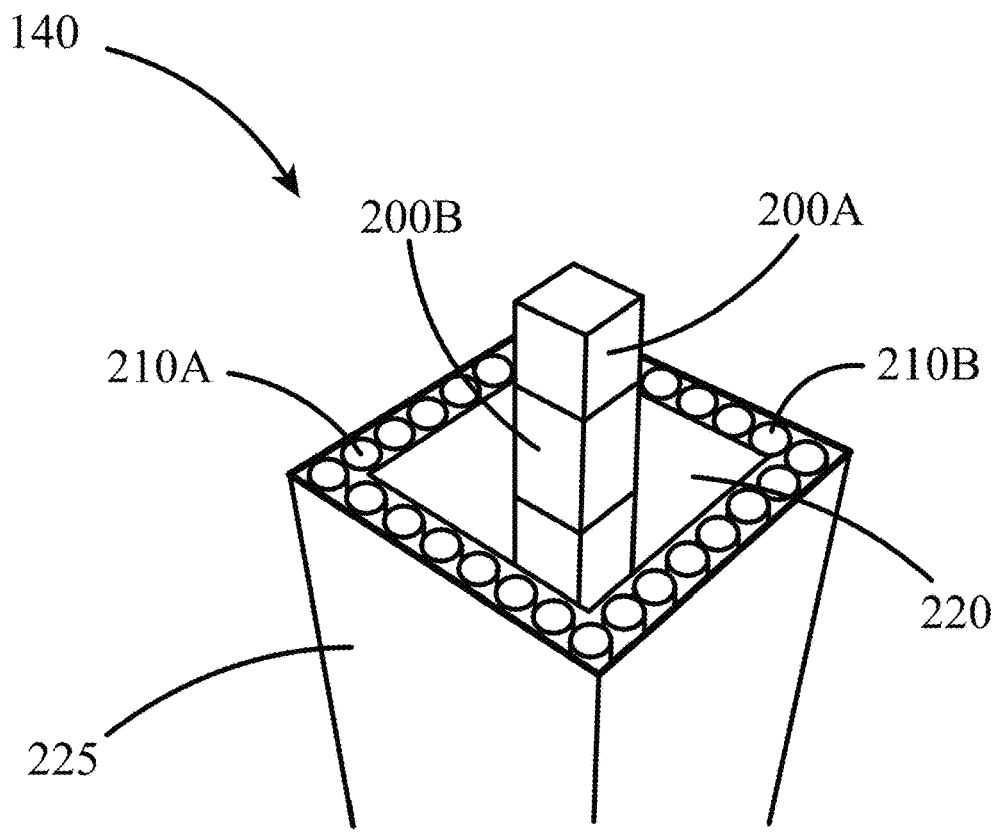
FIG. 2A illustrates a thermophotovoltaic (TPV) unit that includes a multijunction photovoltaic device, according to some embodiments of the present disclosure.

FIG. 2A illustrates a TPV unit 140, according to some embodiments of the present disclosure. In this example, the TPV unit 140 includes a stack of multiple PV devices (200A and 200B) positioned centrally within a space 220 formed by the walls, in this case four walls, of an emitter 225. The walls of the emitter 225 may include a plurality of HT fluid channels (e.g. 210A and 210B), through which the hot HT fluid 125 may be directed (e.g. by the pump 150). In some embodiments of the present disclosure, the HT fluid channels 210 may form the walls of the emitter. In some embodiments of the present disclosure, the HT fluid channels 210 may be positioned adjacent to at least one external solid surface and/or an internal solid surface. Although this example In some embodiments of the present disclosure, any of the individual unit operations (e.g. pump, tanks, piping, and/or TPV unit, etc.) of a TPV energy system 100, may utilize 553 metallurgical grade (98.5% pure) silicon as the HT fluid (115 and 125). The liquid silicon HT fluid may be stored in the first tank 110 at about 1900° C. Transfer of the silicon HT fluid (115 and 125) through the TPV energy system 100 may be achieved using an all graphite seal-less sump pump 150. In some embodiments, such a pump 150 may transfer the cold HT fluid 115A to a heat source 120 constructed of a series of pipes that are externally irradiated by electrically powered graphite heaters, resulting in hot HT fluid 125A of liquid silicon at a temperature of up to about 2400° C. This hot HT fluid 125A may then be stored in the second tank 130. In some embodiments of the present disclosure, the tanks (110 and 130) may be relatively large, with diameters on the order of about 10 meters, which allows the surface area to volume ratio to be small enough that energy losses to the environment may be limited to less than 1% of the energy stored per day.

When electricity production is desired, the hot HT fluid 125B, e.g. liquid silicon at about 2400° C., may be pumped out of the second tank 130 and through the TPV unit 140. Referring again to FIG. 2A, a TPV unit 140 may include an array of graphite HT fluid channels 210 that may be covered in tungsten foil (not shown). The tungsten foil may provide a lower vapor pressure barrier between the graphite HT fluid channels 210 and the PV device(s) 200. In some embodiments of the present disclosure, the PV device(s) 200 may be mounted to an actively cooled (e.g. using circulated cooling water) block that maintains the PV device(s) 200 at a temperature between about 20° C. and about 50° C. Lower PV operating temperatures may increase the power conversion efficiency of the PV device(s) 200. Thus, at least one of the graphite HT fluid channels 210 and/or the tungsten foil may act as a photon emitter, emitting light to the PV device(s) 200, which converts a fraction of this radiant energy to electricity. As the hot liquid silicon HT fluid 125 passes through the HT fluid channels 210 of the TPV unit 140, at least a portion of thermal energy contained in the hot HT fluid is transferred by radiant heat transfer to the PV device(s) 200 and converted to electricity. The resultant cold HT fluid 115C may then be returned to the first tank 110 to be stored until the cycle needs to be repeated (e.g. depending on electricity demand).

Although FIGS. 1 and 2A illustrate a TPV energy system 100 and TPV unit 140 that utilize a heat transfer fluid to heat an emitter 225, it is noted that other TPV energy systems, TPV units, and emitters that utilize other heating systems are possible and are considered within the scope of the present disclosure. For example, a heat source may be integrated directly into an emitter, thus completely eliminating the need for a HT fluid and the associated unit operations, e.g. storage tanks, piping, pump, etc.

Figure 2B:
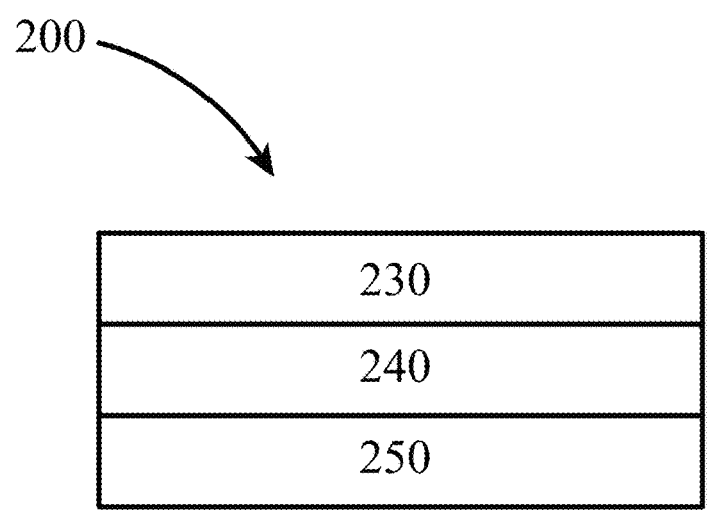
FIG. 2B illustrates a photovoltaic (PV) device suitable for thermophotovoltaic applications, according to some embodiments of the present disclosure.

FIG. 2B illustrates a PV device 200 suitable for a TPV unit 140, according to some embodiments of the present disclosure. In this example, the PV device 200 may include a multijunction PV stack 240 positioned between an outer layer 230 (e.g. a protective layer and/or anti-reflective layer) and a reflective layer 250, where the outer layer 230 is positioned to first receive the light from the emitter 225 (e.g. the outer layer 230 is positioned closest to emitter 225). As used herein, the term "stack" refers to a device that includes two or more layers of differing composition, thicknesses, etc., that are positioned one on top of the other relative to a reference axis that is essentially perpendicular to the planes of each of the layers. The PV device 200 which converts photons radiated from the emitter 225 may have a significant role in the TPV energy system's thermal energy to electricity conversion efficiency. The energy in a photon ($eV_{photon}$) incident on a PV device 200 can suffer several types of losses, which are very strongly dependent on the spectrum of light, and on the design of the PV device itself. The most significant is the voltage loss, where an incident photon is absorbed by the PV device 200 and converted into electrical current, at a cell open-circuit voltage $V_{OC} < V_{photon}$. This energy loss $E_{loss} = eV_{photon} - eV_{OC}$ can be partitioned into two individual losses related to the junction bandgap ($E_g$): $E_{loss} = (eV_{photon} - E_g) + (E_g - eV_{OC})$.

The first loss, referred to as thermalization loss, arises because the thermally-radiated spectrum contains a wide range of photon energies, and the energy above the bandgap is lost. To mitigate this loss, in some embodiments of the present disclosure, a PV device 200 that includes a multi-junction PV stack 240 may be used, for example a two junction PV stack 240, which has been designed to provide two bandgaps chosen to optimally convert a specific portion of the light spectrum that corresponds to a specific $T_w$ and/or $T_w$ range. The $E_g - eV_{OC}$ penalty is proportionally smaller for higher bandgap materials than for lower bandgap materials. Thus, for some of the embodiments described herein, the relatively high emitter temperatures ($T_w$) used, e.g. between about 1500° C. and about 3000° C., may generate correspondingly high-energy photons for which relatively high-bandgap multijunction PV stacks 240 are suitable, thus minimizing and/or eliminating the $E_g - eV_{OC}$ penalty. Similarly, the high $T_w$ temperatures used herein may also result in a very high flux of photons, which increases $eV_{OC}$, further suppressing this penalty. A type of absorption loss also occurs at the system level and results from the free carrier absorption of sub-bandgap photons, either at the reflective layer 250 or in the semiconductor material itself used to construct the multijunction PV stack 240. A reflective layer 250 should be as reflective as possible, so that unusable sub-bandgap photons can be reflected back through the PV device 200 for another chance at being absorbed and/or reflected back to the emitter 225.

Figure 3A:
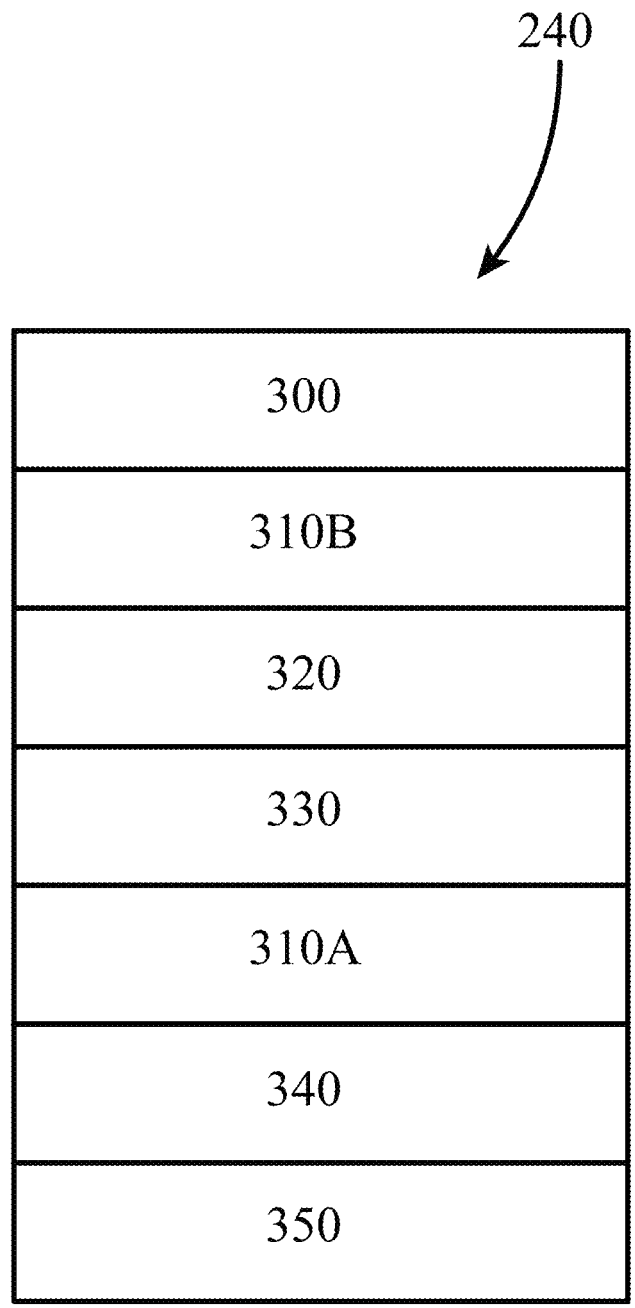
FIGS. 3A-3D illustrate schematic cross-sections of multijunction PV stacks for use in a PV device suitable for use in thermophotovoltaic systems, according to some embodiments of the present disclosure.

FIG. 3A illustrates a multijunction PV stack 240, in this case a two junction PV stack, according to some embodiments of the present disclosure. As described herein, some embodiments of multijunction PV stacks 240 may include some or all of the individual elements shown in FIG. 3A. Thus, in some embodiments of the present disclosure, a multijunction PV stack 240 may include a first junction 320 and second junction 340, where the first junction 320 is positioned to receive light first from the emitter 225 and the second junction 340 is positioned to receive light second (e.g. the light that was transmitted through the first junction 320). Thus, the first junction 320 may be designed to have a first bandgap, and the second junction 340 may be designed to have a second bandgap, where the first bandgap is larger than the second bandgap. In some embodiments of the present disclosure, a multijunction PV stack 240 may include a tunnel junction 330 that is positioned between the first junction 320 and the second junction 340. A tunnel junction is a type of diode with degenerate doping on both sides. Carriers can cross the junction by means of quantum mechanical tunneling. The tunnel junction provides electrical conduction between a p-type layer on one side and an n-type layer on the other side.

In addition, a multijunction PV device 240 may include a first buffer layer 310A positioned between the first junction 320 and the second junction 340. In some embodiments of the present disclosure, a first buffer layer 310A may be positioned between the tunnel junction 330 and the second junction 340. A first buffer layer 310A, and a buffer layer in general, may be a series of thin layers with progressively larger (or smaller) lattice constants. Changing the lattice constant induces strain in the semiconductor, which can lead to threading dislocations that degrade the material. The first buffer layer 310A helps to relieve the strain in a controlled manner, to enable growth of the second junction 340 with high quality. In some embodiments of the present disclosure, a multijunction PV stack 240 may include a substrate 300 and a second buffer layer 310B, where the second buffer layer 310B is positioned between the substrate 300 and the first junction 320. A substrate 300 may be a thick semiconductor on which the epitaxial layers are deposited. Substrates are typically polished, are purchased from a manufacturer, and are typically 300-650 µm thick. Examples of common substrates include GaAs, InP, InAs, GaSb, Ge and Si. Referring again to FIG. 3A, a multijunction PV stack 240 may include a handle 350, where the second junction 340 is positioned adjacent to the handle. The handle is a material to which the epitaxial layers are secured, to provide mechanical stability after the substrate is etched away. Examples include silicon, glass and flexible foil, although other handles are possible. The handle can be electrically insulating or conductive.

Referring again to FIG. 3A, the multijunction stack 240 may be grown by metalorganic vapor phase epitaxy (MOVPE), although other techniques such as molecular beam epitaxy (MBE) or hydride vapor phase epitaxy (HVPE) are also possible. The stack may be grown inverted on the substrate 300, starting with the first buffer layer 310B and finishing with the second junction 340. MOVPE growth typically occurs at temperatures between about 550° C. and about 800° C. and at pressures between about 0.01 Torr and 760 Torr. After growth, a back contact (not shown) may be deposited on the second junction 340, the multijunction PV stack 240 secured to a handle 350, and the substrate 300 may be removed. In some embodiments of the present disclosure, the first buffer layer 310B may also be removed. Front metal contacts (not shown) may then be deposited, the individual devices may be isolated by either wet-chemical etching or reactive ion etching, and finally an anti-reflection coating (not shown) may be deposited on the front surface; e.g. on the outer surface of the first junction 320.

Figure 3B:
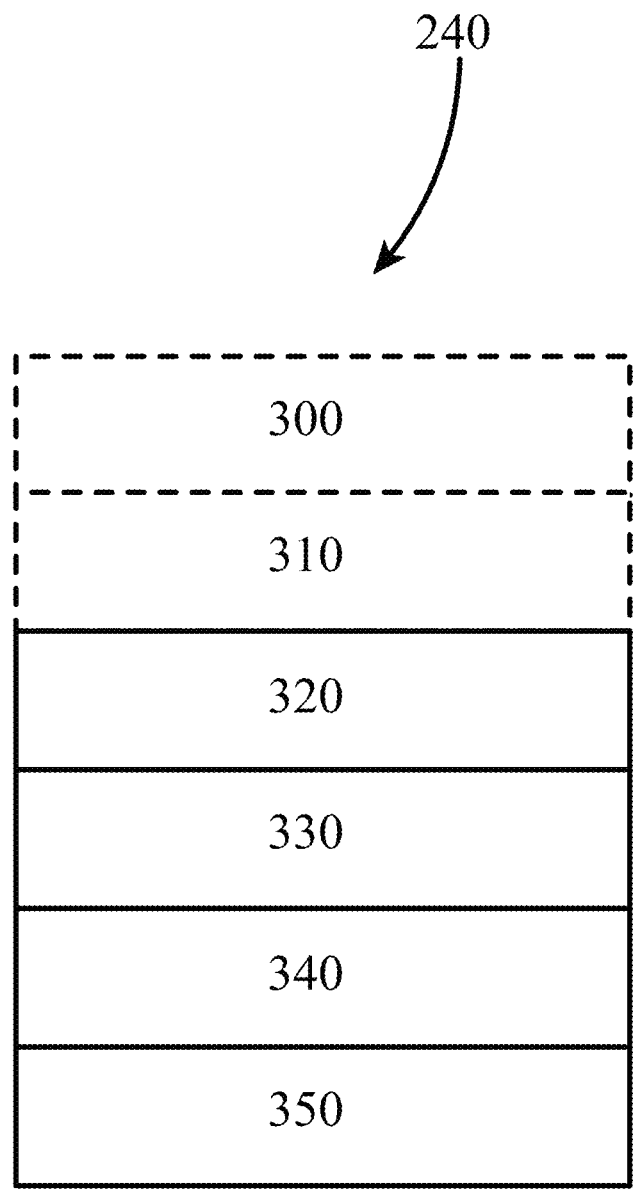

FIG. 3B illustrates an example of a multijunction PV stack 240, according to some embodiments of the present disclosure. In this example, the multijunction PV stack 240 has two junctions, a first junction 320 and a second junction 340 with a tunnel junction 330 positioned between the first junction 320 and the second junction 340. FIG. 3B also shows a multijunction PV stack 240 having a handle 350 to provide mechanical support for handling after the deposition processes to make the multijunction PV stack 240 are completed. In this example, the substrate 300 is used as a starting surface for depositing at least one buffer layer 310, whose final layer is lattice-matched to the first junction 320. This substrate 300, as well as the buffer layer 310 itself, may be removed (as indicated by the dotted lines) from the multijunction PV stack 240, resulting in the final device, a monolithic multijunction PV stack 240 having a first junction 320, a tunnel junction 330, a second junction 340, and a handle 350. Once removed, the substrate 300 and/or the buffer layer 310 may be recycled and/or reused to make additional multijunction PV stacks 240.

In some embodiments of the present disclosure, a multijunction PV stack 240 similar to that shown in FIG. 3B may utilize a substrate 300 constructed of at least one of GaAs and/or germanium. A first junction 320 may be constructed of an alloy that includes at least one of $Al_xGa_yIn_{1-x-y}As$, where $0 \leq x \leq 1$ and $0 \leq y \leq 1$ and/or an alloy that includes $Ga_yIn_{1-y}As_zP_{1-z}$, where $0 \leq y \leq 1$ and $0 \leq z \leq 1$. In general, the first junction 320 may include any III-V alloy composition that provides a bandgap between 1.1 eV and 1.5 eV optimized for absorbing light radiated by an emitter having an operating temperature, $T_w$, between about 1700° C. and about 2400° C. For example, a multijunction PV stack 240 similar to that shown in FIG. 3B may have a first junction 320 that includes at least one of $Al_{0.15}Ga_{0.55}In_{0.3}As$ and/or $Ga_{0.5}In_{0.5}As_{0.57}P_{0.43}$. The buffer layer 310 may include a compositionally graded buffer layer, having between 2 and 15 layers and composition of $Ga_xIn_{1-x}P$ where x is varied between 0.51 and 0.20, or similarly $Al_xGa_yIn_{1-x-y}As$, where the In-content is varied, to provide a final layer of the buffer that is lattice-matched to the first junction 320. In general, the graded buffer layer may include any III-V alloy composition that accesses the lattice-constant of the first junction.

Referring again to FIG. 3B, the second junction 340 may be constructed of an alloy that includes $Ga_yIn_{1-y}A$ where $0 \leq y \leq 1$. In general, the second junction 340 may include any III-V alloy composition that provides a bandgap between 0.9 eV and 1.3 eV optimized for absorbing light radiated by an emitter having an operating temperature, $T_w$, between about 1700° C. and about 2400° C. For example, a multijunction PV stack 240 similar to that shown in FIG. 3B may have a second junction 340 that includes $Ga_{0.7}In_{0.3}As$. Further, as shown in FIG. 3B, this exemplary multijunction PV stack 240 may include a tunnel junction 330 positioned between the first junction 320 and the second junction 330, where the tunnel junction 330 is constructed of an alloy that includes, for example, GaInAs and/or GaAsSb. This exemplary multijunction PV stack 240 also includes a front contact layer of the same lattice constant as the first junction 320, for example an alloy of GaInAs or GaInAsN.

Figure 3C:
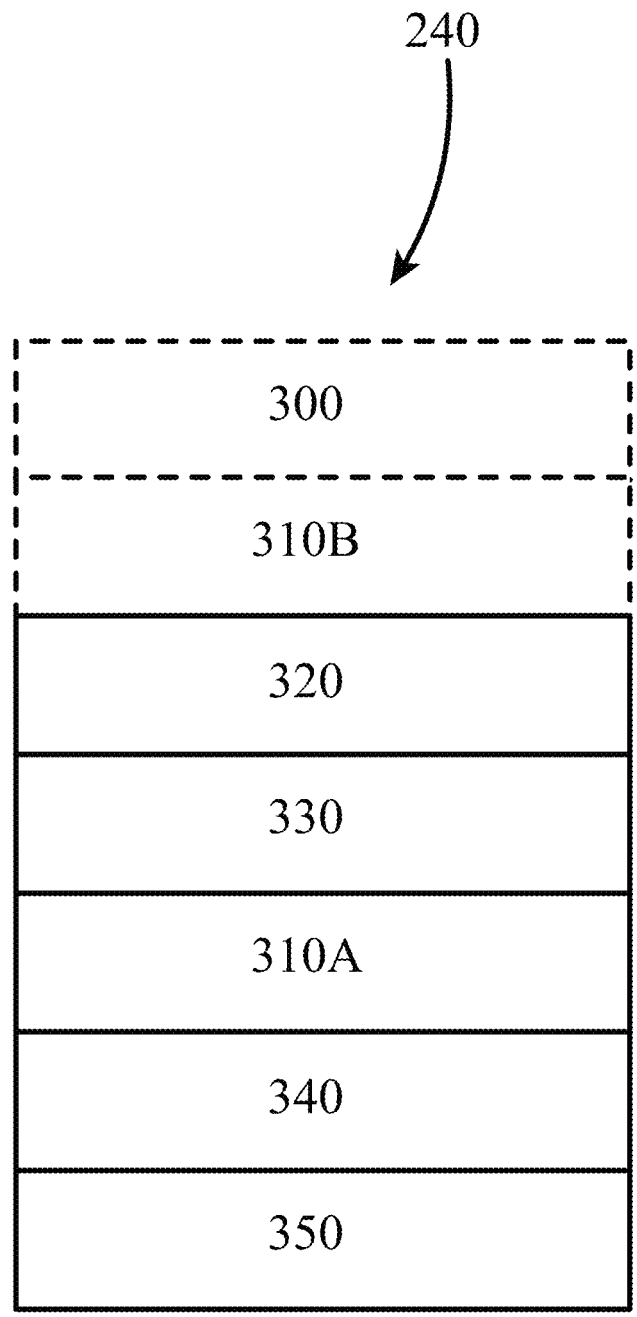

FIG. 3C illustrates another example of a multijunction PV device 240 suitable for TPV energy systems, according to some embodiments of the present disclosure. In this example, the multijunction PV stack 240 has two junctions, a first junction 320 and a second junction 340 with a tunnel junction 330 positioned between the first junction 320 and the second junction 340. In addition, this example includes a first buffer layer 310A positioned between the tunnel junction 320 and the second junction 340. This first buffer layer 310A is provided to overcome the lattice-mismatch between the first junction 320 and the second junction 340. FIG. 3C also shows a multijunction PV stack 240 having a handle 350 to provide mechanical support for handling after the deposition processes to make the multijunction PV stack 240 are completed. In this example, a substrate 300 is used as a starting surface for depositing a second buffer layer 310B whose final layer is lattice-matched to the first junction 320. This substrate 300, as well as the second buffer layer 310B itself, may be removed (as indicated by the dotted lines) from the multijunction PV stack 240, resulting in the final device, a monolithic multijunction PV stack 240 having a first junction 320, a tunnel junction 330, a first buffer layer 310A, a second junction 340, and a handle 350. Once removed, the substrate 300 and/or the second buffer layer 310B may be recycled and/or reused to make additional multijunction PV stacks 240.

In some embodiments of the present disclosure, a multijunction PV stack 240 similar to that shown in FIG. 3C may utilize a substrate 300 constructed of at least one of GaAs and/or germanium. A first junction 320 may be constructed of an alloy that includes $Al_xGa_yIn_{1-x-y}As$, where $0 \le y \le 1$. In general, the first junction 320 may include any III-V alloy composition that provides a bandgap between 1.1 eV and 1.3 eV optimized for absorbing light radiated by an emitter having an operating temperature, $T_w$, between about 1700° C. and about 2200° C. For example, a multijunction PV stack 240 similar to that shown in FIG. 3C may have a first junction 320 that includes at least one of $Ga_{0.85}In_{0.15}As$. The first buffer layer 310A may include a compositionally graded buffer layer, having between 2 and 15 layers and a composition of $Ga_xIn_{1-x}P$ where x is varied between 0.51 and 0.20 to provide a final layer that is lattice-matched to the second junction 340. Similarly, the second buffer layer 310B may include a compositionally graded buffer layer, having between 2 and 15 layers and composition of $Ga_xIn_{1-x}P$ where x is varied between 0.51 and 0.20 to provide a final layer of the buffer that is lattice-matched to the first junction 320. Referring again to FIG. 3C, the second junction 340 may be constructed of an alloy that includes $Ga_yIn_{1-y}A$ where $0 \le y \le 1$. In general, the second junction 340 may include any III-V alloy composition that provides a bandgap between 0.9 eV and 1.1 eV optimized for absorbing light radiated by an emitter having an operating temperature, $T_w$, between about 1700° C. and about 2200° C. For example, a multijunction PV stack 240 similar to that shown in FIG. 3C may have a second junction 340 that includes $Ga_{0.7}In_{0.3}As$. Further, as shown in FIG. 3C, this exemplary multijunction PV stack 240 may include a tunnel junction 330 positioned between the first junction 320 and the second junction 330, where the tunnel junction 330 is constructed of an alloy that includes at least one of GaInAs and/or GaAsSb. This exemplary multijunction PV stack 240 also includes a front contact layer of the same lattice constant as the first junction 320, for example an alloy of GaInAs or GaInAsN.

Figure 3D:
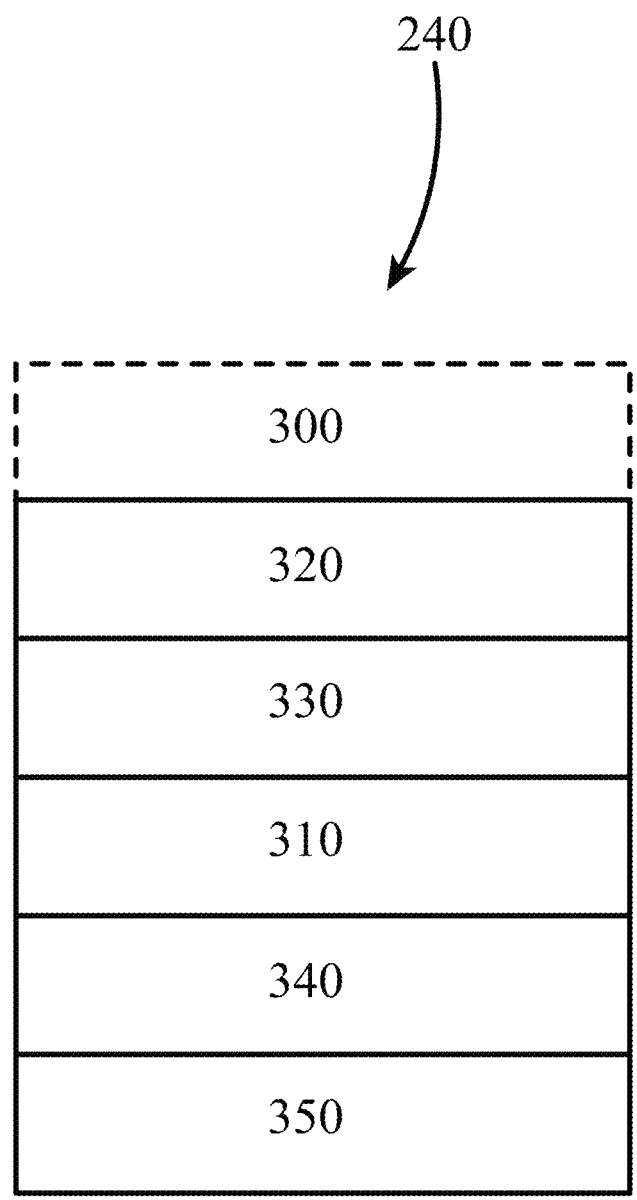

FIG. 3D illustrates another example of a multijunction PV device 240 suitable for TPV energy systems, according to some embodiments of the present disclosure. In this example, the multijunction PV stack 240 has two junctions, a first junction 320 and a second junction 340 with a tunnel junction 330 positioned between the first junction 320 and the second junction 340. In addition, this example includes a buffer layer 310 positioned between the tunnel junction 320 and the second junction 340. This buffer layer 310 is needed to overcome the lattice-mismatch between the first junction 320 and the second junction 340. FIG. 3D also shows a multijunction PV stack 240 having a handle 350 to provide mechanical support for handling the stack after the deposition processes to make the multijunction PV stack 240 are completed. In this example, a substrate 300 is used as a starting surface for depositing the first junction 320. This substrate 300 may be removed (as indicated by the dotted lines) from the multijunction PV stack 240, resulting in the final device, a monolithic multijunction PV stack 240 having a first junction 320, a tunnel junction 330, a buffer layer 310, a second junction 340, and a handle 350. Once removed, the substrate 300 may be recycled and/or reused to make additional multijunction PV stacks 240.

In some embodiments of the present disclosure, a multijunction PV stack 240 similar to that shown in FIG. 3D may utilize a substrate 300 constructed of at least one of GaAs and germanium. A first junction 320 may be constructed of an alloy that includes at least one of $Al_yGa_{1-y}As$, where $0 \le y \le 1$; $Al_xGa_yIn_{1-x-y}P$, where $0 \le x \le 1$ and $0 \le y \le 1$ and the alloy is lattice-matched to the substrate 300; and/or $Ga_xIn_{1-x}As_yP_{1-y}$ where $0 \le x \le 1$ and $0 \le y \le 1$ and the alloy is lattice-matched to the substrate 300. In general, the first junction 320 may include any III-V alloy composition that provides a bandgap between 1.3 eV and 1.5 eV optimized for absorbing light radiated by an emitter having an operating temperature, $T_w$, between about 2000° C. and about 2500° C. The buffer layer 310 may include a compositionally graded buffer layer, having between 2 and 15 layers and composition of $Ga_xIn_{1-x}P$ where x is varied between 0.51 and 0.20, or similarly $Al_xGa_yIn_{1-x-y}As$, where the In-content is varied, to provide a final layer of the buffer that is lattice-matched to the second junction 340. In general, the graded buffer layer may include any III-V alloy composition that accesses the lattice-constant of the second junction. Referring again to FIG. 3D, the second junction 340 may be constructed of an alloy that includes $Ga_yIn_{1-y}A$ where $0 \le y \le 1$. In general, the second junction 340 may include any III-V alloy composition that provides a bandgap between 1.1 eV and 1.3 eV optimized for absorbing light radiated by an emitter having an operating temperature, $T_w$, between about 2200° C. and about 2400° C. For example, a multijunction PV stack 240 similar to that shown in FIG. 3D may have a second junction 340 that includes $Ga_{0.85}In_{0.15}As$. Further, as shown in FIG. 3D, this exemplary multijunction PV stack 240 may include a tunnel junction 330 positioned between the first junction 320 and the second junction 330, where the tunnel junction 330 is constructed of alloys that include at least one of GaAs and/or AlGaAs. In this exemplary embodiment, the front contact layer has the same lattice constant as the substrate 300 and could be constructed of alloys including at least one of GaAs and/or GaInAsN.

The graded layers 310 described above typically have between 2 and 15 layers and composition of $Ga_xIn_{1-x}P$ where x is varied between 0.51 and 0.20. Other alloys are also possible, for example $Al_xGa_yIn_{1-x-y}As$, where the In-content varies between 0 and 0.4, or $Al_xGa_{1-x}As_ySb_{1-y}$, where y varies between 0 and 0.4. In general, the alloy the graded buffer layer may include any III-V alloy composition that accesses the lattice-constant of the mismatched junction.

For all multijunction PV stacks 240 described in the paragraphs above, the back reflector may be deposited between the second junction 340 and the handle 350. For the multijunction PV cell 240 to operate efficiently as a TPV converter, the reflector should have a very high average reflectance (>95%) over all wavelengths from the bandgap (in wavelength units) of the second junction 340 to ~10 µm. The bandgap $E_g$ in wavelength units of µm can be calculated as $1.24/E_g(eV)$. For example, GaAs has a bandgap of 1.42 eV, or equivalently 0.87 µm.

Figure 4:
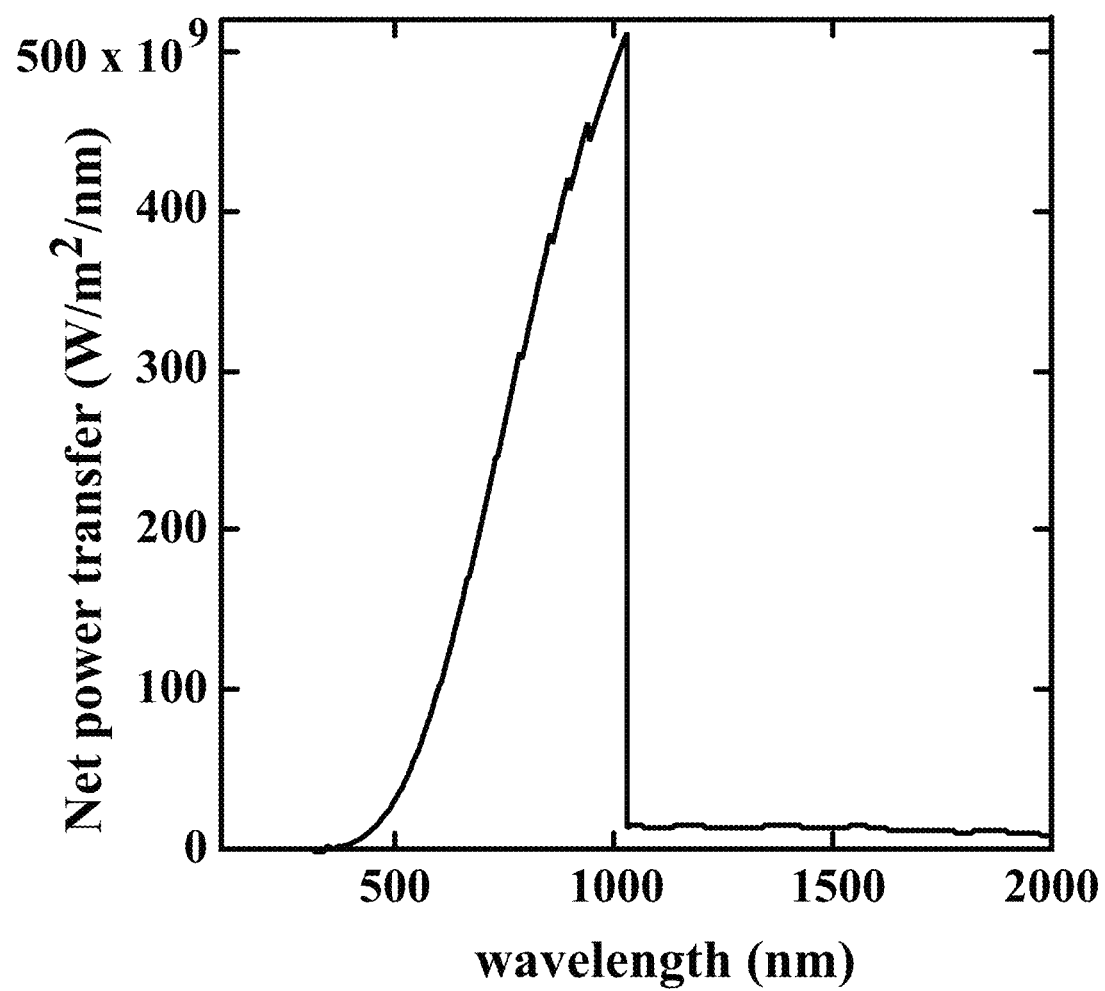
FIG. 4 illustrates the net power transfer between a 2000° C. tungsten emitter and a 1.2 eV bandgap first junction. 100% absorption above the bandgap is assumed, and 2% parasitic absorption below the bandgap. The long wavelength tail extends out to 10 μm (not shown).
Figure 5:
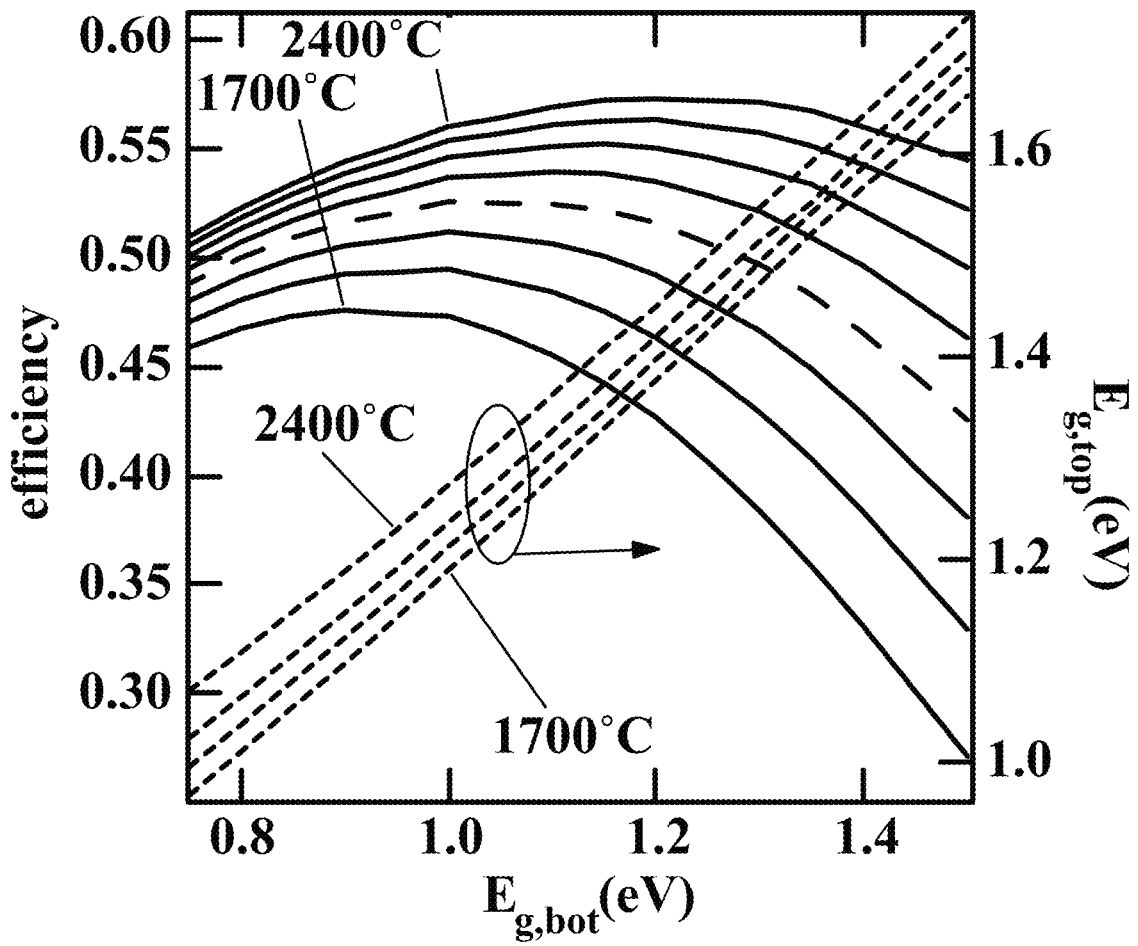
FIG. 5 illustrates two-junction PV stack efficiencies under modified blackbody emission spectra at temperatures between about 1700° C. and about 2400° C., according to some embodiments of present disclosure. The dashed curve highlights the 2000° C. result. The bottom axis indicates the second (bottom) junction bandgap, and the dashed lines and right axis indicates the first (top) junction bandgap.

In some embodiments of the present disclosure, a multijunction PV stack 240 for a TPV energy system 100 may be designed for an emission spectrum produced by an emitter 225 operating at a $T_w$ of about 2000° C. with some modifications for parasitic absorption effects, as shown in FIG. 4. For this example, the multijunction PV stack 240 was modeled assuming GaAs-like absorption coefficients, a bandgap-voltage offset $W_{oc}$ $(=E_g/q-V_{oc})=0.4$ at 1000 W/m², and with thinning of the first (top) junction as necessary for current matching. FIG. 5 shows the efficiencies for two junction PV stacks 240 under the 2000° C. spectrum (long-dashed line) as well as at other temperatures (solid lines). The x-axis shows the second (bottom) junction bandgap. The short-dashed lines show the corresponding first (top) junction bandgap on the right-vertical axis, and the model indicates that the optimum bandgaps are about 1.2 eV and about 1.0 eV for the 2000° C. emission spectrum, for the first junction and second junction respectively.

To achieve a high-performance multijunction PV stack 240 with these bandgaps, some embodiments of the present disclosure include an inverted lattice-mismatched photovoltaic stack 240 on a GaAs substrate 300. The growth may have a single compositionally graded buffer layer (CGB) to the appropriate lattice constant, and then a contact layer, first (top) junction, tunnel junction, second (bottom) junction, and back contact. During processing, the entire CGB layer may be etched away, so that the transparency of the CGB is irrelevant. This distinguishes some of the embodiments described herein from other inverted metamorphic (IMM) multijunction PV stacks where the CGB remains part of the final structure and therefore should be transparent to long wavelength light. Removing the CGB also greatly reduces the free carrier absorption in the structure, which improves the efficiency of the TPV energy system 100.

Figure 6A:
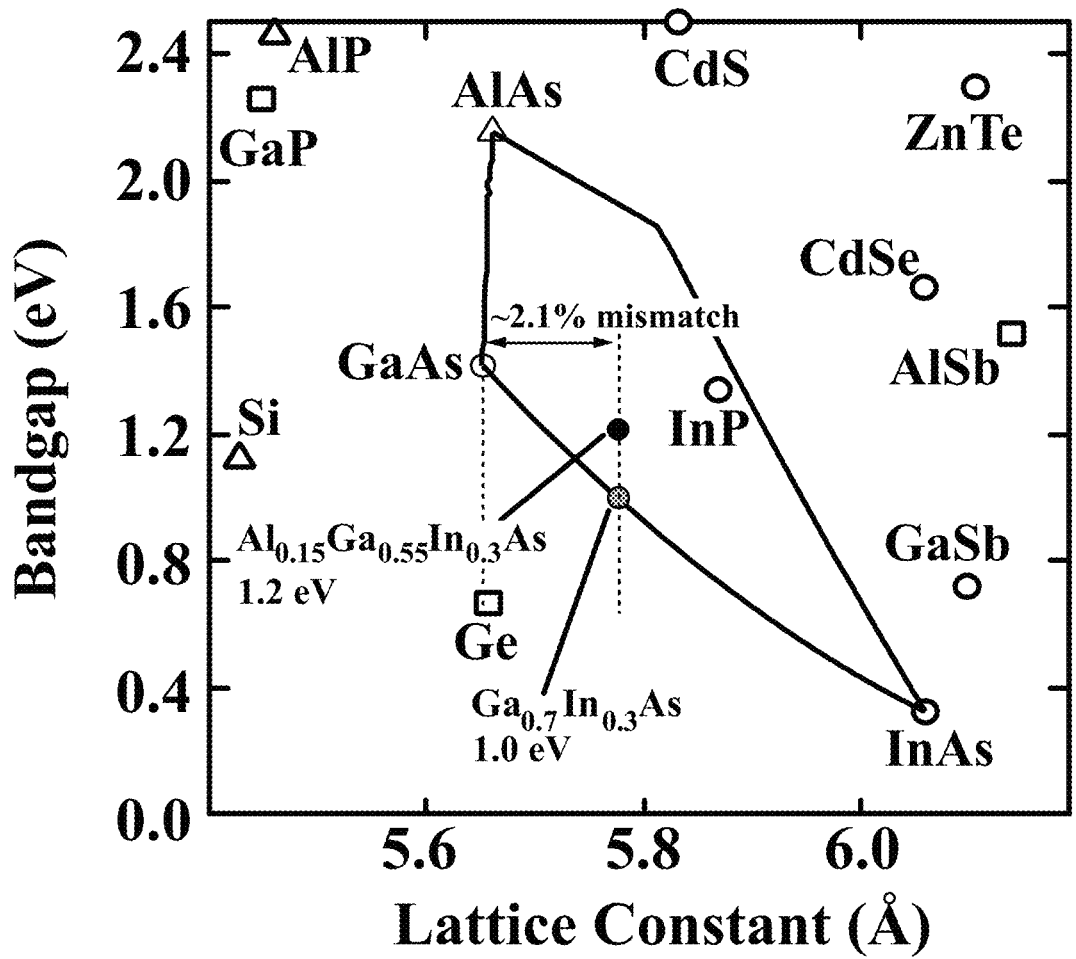
FIGS. 6A and 6B illustrate alloy compositions for two junctions TPV devices, according to some embodiments of the present disclosure.

FIG. 6A shows alloy compositions for an exemplary design for a multijunction PV stack 240, according to some embodiments of the present disclosure. The second (bottom) junction may be constructed of $Ga_{0.7}In_{0.3}As$ and the first (top) junction may be constructed of $Al_{0.15}Ga_{0.55}In_{0.3}As$, both with a nominal relaxed lattice constant of 5.775 Å. This results in a ~2.1% mismatch relative to the GaAs substrate. A CGB, grown between the substrate and the first junction, to address this lattice mismatch, can be at least one of a GaInP-based alloy and/or an AlGaInAs-based alloy. A window layer (not shown in the figures) may be provided having a composition, e.g. AlGaInP, that provides a suitable lattice constant, e.g. of about 5.775 Å. A tunnel junction may be positioned between the first junction and the second junction, using a suitable alloy, for example, at least one of GaInAs and/or GaAsSb. A cross-sectional schematic of a design for a multijunction PV stack 240 utilizing these exemplary alloys for the first junction and the second junction is shown in FIG. 3B, which is described in detail above. The AlGaInAs alloy in the design of FIG. 6A and FIG. 3B could be replaced with a quaternary alloy of $Ga_{0.5}In_{0.5}As_{0.57}P_{0.43}$ that has a bandgap of ~1.2 eV and is lattice matched to the 1.0 eV bandgap of a $Ga_{0.7}In_{0.3}As$ second junction.

Figure 6B:
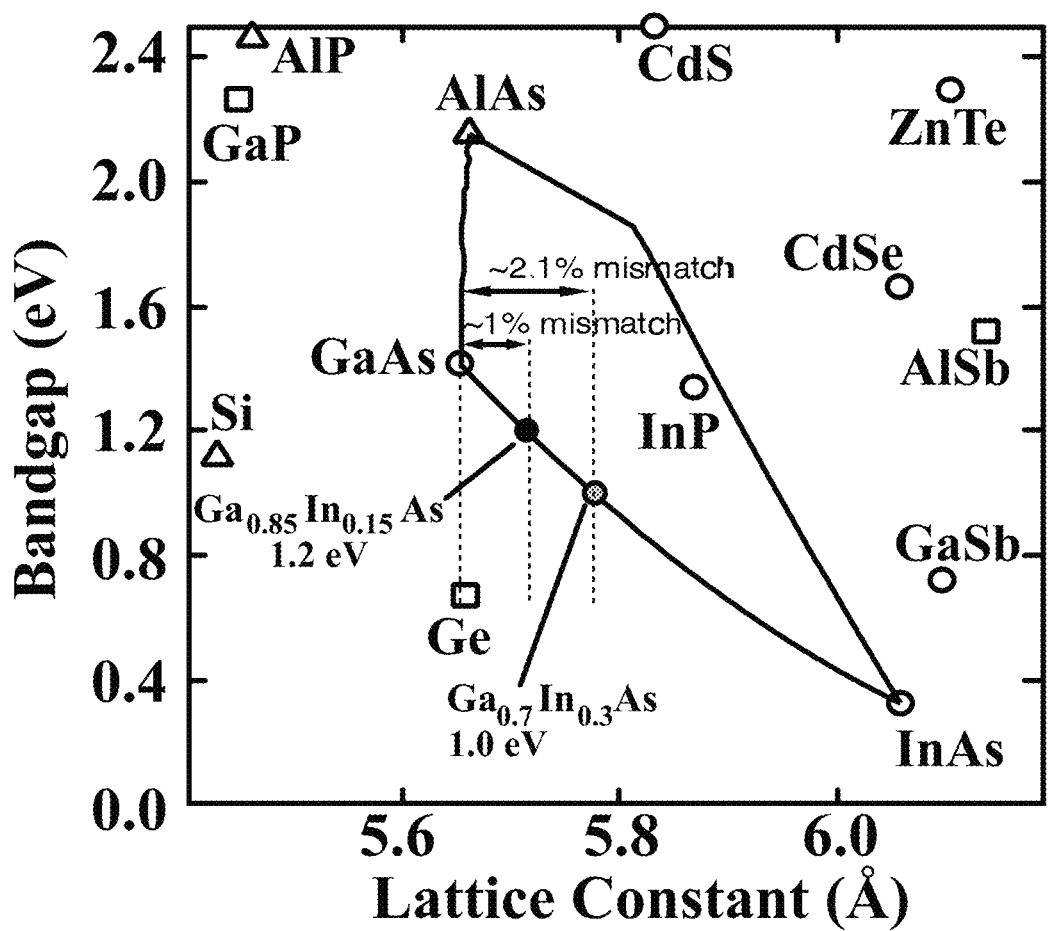

FIG. 6B illustrates another possible alloy composition, according to some embodiments of the present disclosure. In this example, a first (top) junction may be constructed of an alloy of $Ga_{0.85}In_{0.15}As$ having a bandgap of about 1.2 eV. The second (bottom) junction may be constructed of an alloy of $Ga_{0.7}In_{0.3}As$ having a bandgap of about 1.0 eV. A cross-sectional schematic of a design for a multijunction PV stack 240 utilizing these exemplary alloys for the first junction and the second junction is shown in FIG. 3C. For this particular design of a multijunction PV stack, two CGB layers and two GaInAs junctions of different compositions may be utilized. During processing, the first CGB, positioned between the substrate and the first junction, may be etched away, while the second CGB positioned between the first junction and the second junction remains part of the multijunction PV stack 240. In this design, the transparency of the first CGB is irrelevant, but the second CGB should be transparent to light with energy between the bandgaps of the first and second junctions.

The tandem cell efficiencies summarized in FIG. 5 show the bandgap combination of 1.4 eV/1.2 eV is very nearly as efficient as 1.2/1.0 eV for the 2000° C. emitter temperature which is the focus of some embodiments of the present disclosure, at least partly because it is easier to manufacture in practice because of the smaller lattice mismatch. FIG. 3D shows another embodiment of a design to achieve that bandgap combination. Also, as shown in FIG. 5, other bandgap combinations may be more appropriate for other emission temperatures. The architecture described here and illustrated in FIGS. 6A and 6B and FIGS. 3A-3D may be modified as appropriate, grading to a different lattice constant and adjusting the compositions of the (Al)GaInAs, GaInAsP and/or GaInAs alloys. For example, in some embodiments of the present disclosure, a PV stack may be constructed with the general architecture of that illustrated in FIG. 3B, however, with the bandgaps of the PV stack illustrated in FIG. 3D. For this example, the PV stack may have a CGB with a lattice constant of about 5.714 Å, corresponding to the lattice constant of a second junction constructed of GaInAs and having a bandgap of about 1.2 eV; then a front contact layer; then a 1.4 eV first junction constructed of at least one of an alloy of about $Al_{0.15}Ga_{0.7}In_{0.15}As$ and/or about $Ga_{0.63}In_{0.37}As_{0.53}P_{0.47}$; then a lattice-mismatched tunnel junction; and then a second junction constructed of an alloy approximating $Ga_{0.85}In_{0.15}As$, having a bandgap of about 1.2 eV. Similarly, as in FIG. 3B, the CGB would be etched away during processing. This bandgap combination of 1.4/1.2 eV is optimized for an emitter operating at a temperature, Tw, of about 2400°.

Figure 7A:
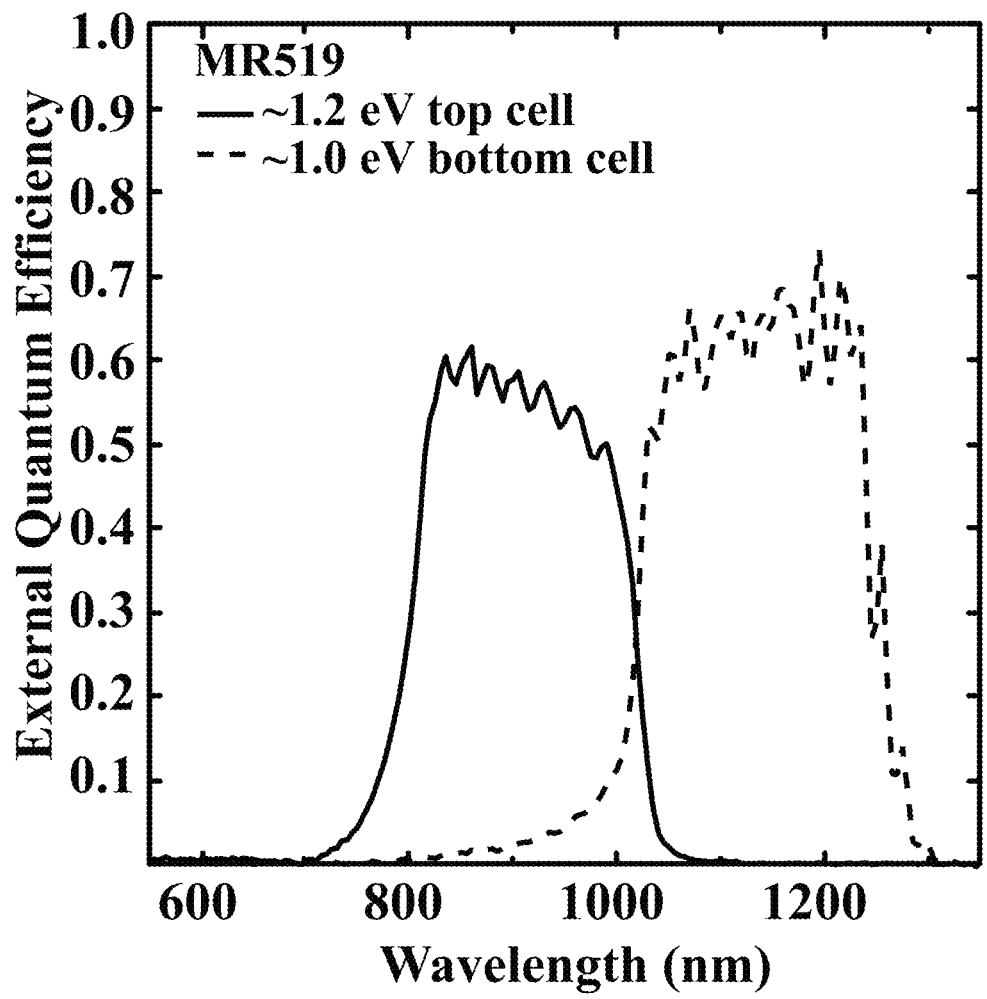
FIG. 7A illustrates external quantum efficiencies collected for a PV device designed for TPV energy systems, according to some embodiments of the present disclosure.
Figure 7B:
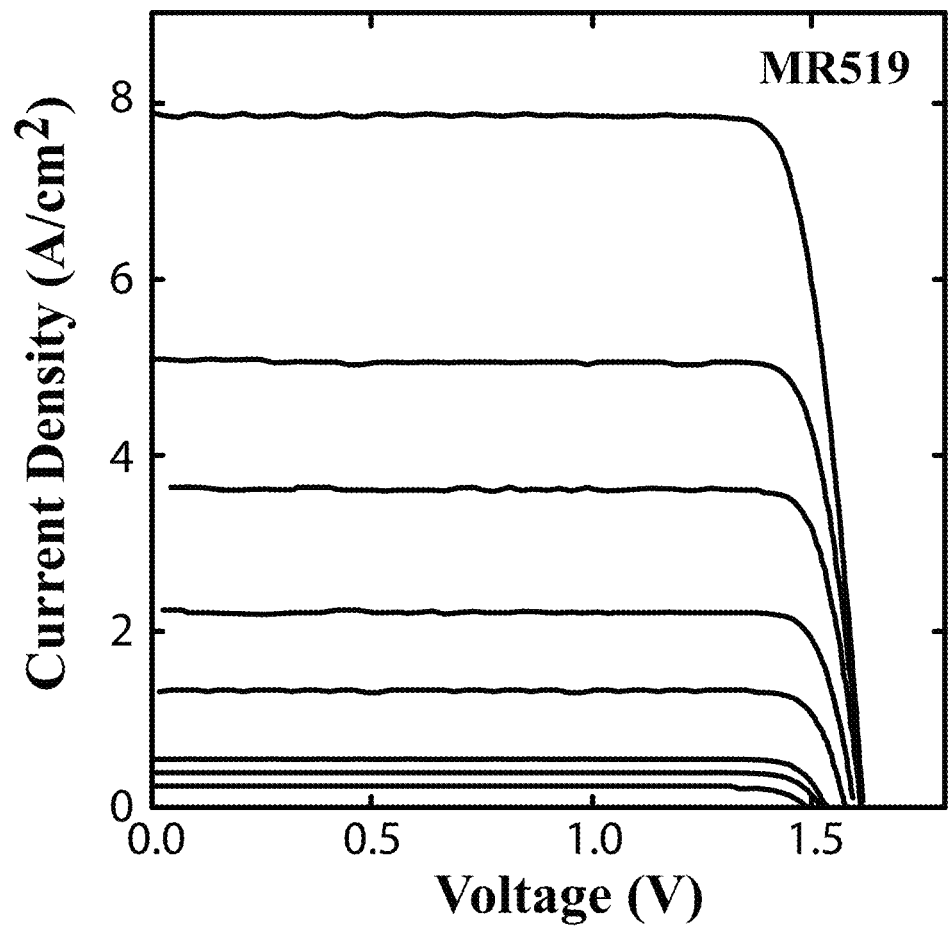
FIG. 7B illustrates the current-voltage curves collected for a PV device designed for TPV energy systems, according to some embodiments of the present disclosure.

FIGS. 7A and 7B illustrate the measured quantum efficiencies and the current-voltage curves respectively for a PV stack constructed for a TPV energy system, according to some embodiments of the present disclosure. This exemplary PV stack is similar to the stack generally illustrated in FIG. 3B and described above. This PV stack, having the identifying name of "MR519", was designed and constructed to have a first junction with a first bandgap of about 1.2 eV and a second junction with a second bandgap of about 1.0 eV. MR519 was constructed as an inverted metamorphic (IMM) two-junction PV device having a compositionally graded buffer (CGB) layer and the two junctions at the same lattice-mismatched lattice constant. The first junction was constructed with an alloy of about $Al_{0.15}Ga_{0.56}In_{0.29}As$ and the second junction was constructed of an alloy approximating $Ga_{0.71}In_{0.29}As$. Both junctions were a traditional n/p configuration, with a thin emitter and a thick base. Both cells were confined on the front and back sides by $Ga_{0.23}In_{0.77}P$, doped with silicon on the front and zinc on the back. A GaAsSb/GaInAs tunnel junction was positioned between the two junctions.

A difference between this PV stack and the PV stack illustrated in FIG. 3B is that the CGB layer was not removed and remained a part of the final device structure of MR519. Thus, in MR519, the front contact layer (not shown) was grown outside the CGB (e.g. it was grown lattice matched to the substrate, before the CGB). Both lattice-mismatched junctions were at the same lattice constant, with only a tunnel junction positioned between them. FIG. 7A illustrates the measured external quantum efficiency, which correspond to bandgaps of about 1.23 eV and about 1.0 eV for the first junction and second junction, respectively. These bandgaps are nearly optimal for a TPV system operating with an emitter temperature, $T_w$, between about 1900° C. and about 2100° C. FIG. 7B illustrates the current-voltage curves measured at high concentration, taken on a flash simulator, for PV stack MR519. These current-voltage curves illustrate that there was no evidence of tunnel junction failure up to the highest measured current density, and that the voltage increased with current density.

Figure 8A:
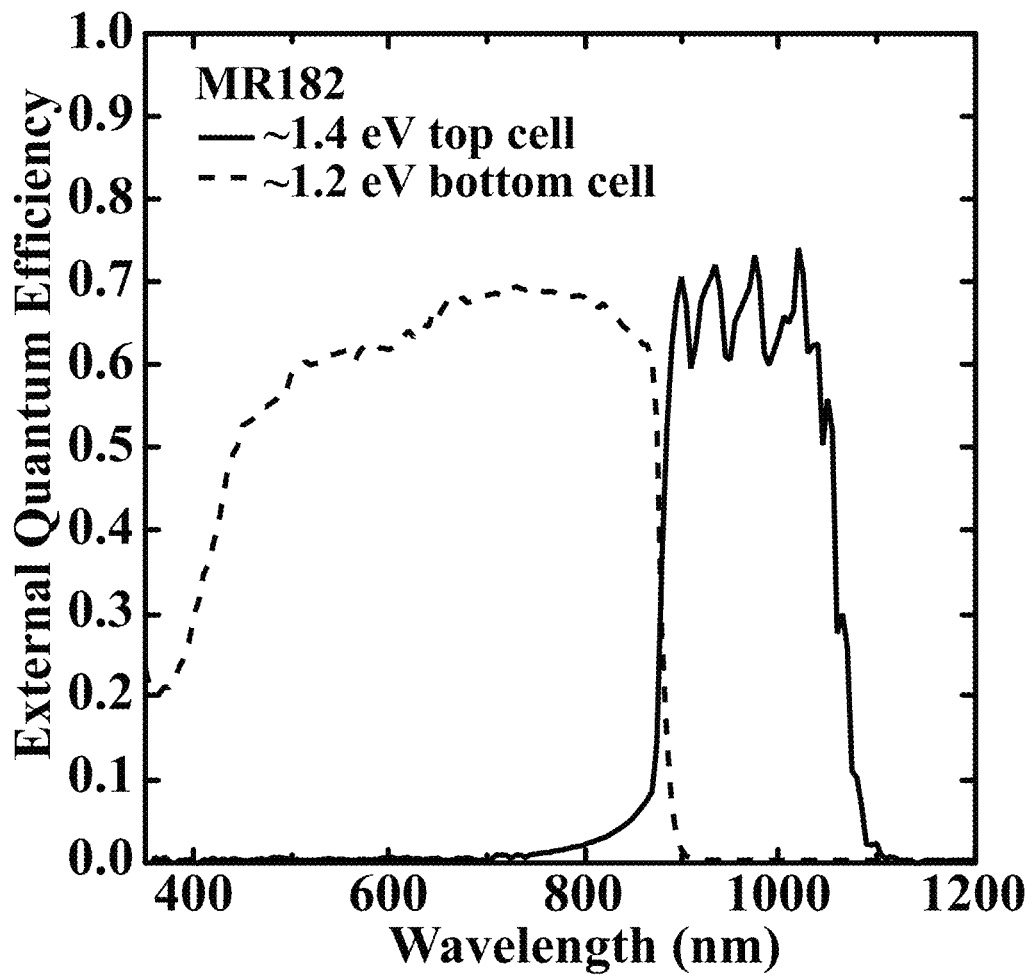
FIG. 8A illustrates external quantum efficiencies collected for a PV device designed for TPV energy systems, according to some embodiments of the present disclosure.
Figure 8B:
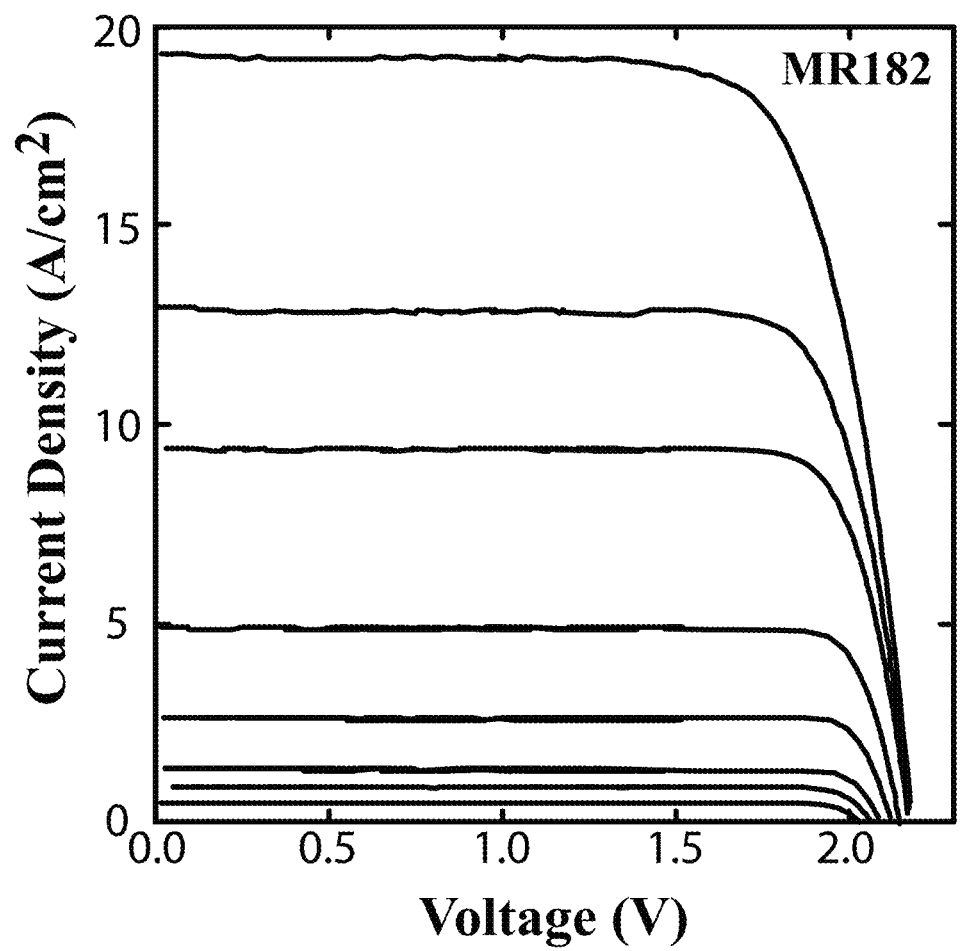
FIG. 8B illustrates the current-voltage curves collected for a PV device designed for TPV energy systems, according to some embodiments of the present disclosure.

FIGS. 8A and 8B illustrate the quantum efficiencies and the current-voltage curves respectively for a PV stack constructed for a TPV energy system, according to some embodiments of the present disclosure. This exemplary stack is similar to the stack generally illustrated in FIG. 3D and described above. This PV stack, having the identifying name of "MR182", was designed and constructed to have a first junction with a first bandgap of about 1.4 eV and a second junction with a second bandgap of about 1.2 eV. MR182 was constructed as an inverted metamorphic (IMM) two-junction PV device having a first junction constructed of GaAs with a bandgap of about 1.4 eV, a compositionally graded buffer (CGB) layer and then a second junction constructed of an alloy approximating $Ga_{0.85}In_{0.15}As$ with a bandgap of about 1.2 eV. Both junctions had a traditional n/p configuration, with a thin emitter and a thick base. Both junctions were confined on the front and back sides by appropriate layers. A GaAs/AlGaAs tunnel junction separated the two junctions and was situated between the GaAs cell and the CGB. FIG. 8A illustrates the measured external quantum efficiency, which corresponds to bandgaps of about 1.41 eV and about 1.18 eV for the first junction and second junction, respectively. These bandgaps are nearly optimal for a TPV energy system operating with an emitter temperature, $T_w$, of about 2400° C. FIG. 8B illustrate the current-voltage curves measured at high concentration, taken on a flash simulator, for PV stack MR182. These current-voltage curves illustrate that there was no evidence of tunnel junction failure up to the highest measured current density, and that the voltage increased with current density.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A two junction thermophotovoltaic (TPV) device comprising, in order:
a first junction having a first composition comprising $Al_xGa_yIn_{1-x-y}As$ or $Ga_aIn_{1-a}As_bP_{1-b}$;
a tunnel junction having a second composition comprising at least one of GaInAs or GaAsSb; and
a second junction having a third composition comprising $Ga_cIn_{1-c}As$, wherein:
the first junction has a bandgap between 1.1 eV and 1.4 eV,
the second junction has a bandgap between 0.9 eV and 1.2 eV, $0.05 \leq x \leq 0.25$, $0.45 \leq y \leq 0.65$, $0.40 \leq a \leq 0.60$, $0.45 \leq b \leq 0.70$, $0.60 \leq c \leq 0.80$, and the TPV device is configured to absorb light from a blackbody operating at a temperature, $T_w$, between 1500° C. and 3000° C.

2. The two junction TPV device of claim 1, wherein the first composition is substantially equal to $Al_{0.15}Ga_{0.55}In_{0.3}As$ or $Ga_{0.5}In_{0.5}As_{0.57}P_{0.43}$.

3. The two junction TPV device of claim 1, wherein the third composition is substantially equal to $Ga_{0.7}In_{0.3}As$.

4. The two junction TPV device of claim 1, wherein $T_w$ is between 1900° C. and 2400° C.

5. The two junction TPV device of claim 1, further comprising:
a substrate comprising at least one of GaAs or Ge, wherein:
the first junction is positioned between the substrate and the tunnel junction.

6. The two junction TPV device of claim 5, further comprising:
a buffer layer having a fourth composition comprising $Ga_wIn_{1-w}P$ or $Al_uGa_vIn_{1-u-v}As$, wherein:

$0.20 \leq w \leq 0.51$, $0.15 \leq u \leq 0.70$, $0.25 \leq v \leq 0.60$, and the buffer layer is positioned between the substrate and the first junction.

7. The two junction TPV device of claim 6, wherein:
the buffer layer is a compositionally graded buffer (CGF) layer,
the CGF layer comprising between 2 and 15 graded layers,
each graded layer comprises the fourth composition, and the graded layer adjacent to the first junction is lattice-matched to the first junction.

8. The two junction TPV device of claim 1, wherein the first junction and second junction each have a lattice constant of about 5.78 Å.

9. The two junction TPV device of claim 1, wherein the first junction, the second junction, and the tunnel junction are substantially lattice matched.

\* \* \* \* \*